United States Patent
Hsiao et al.

(10) Patent No.: US 9,425,191 B2
(45) Date of Patent: Aug. 23, 2016

(54) MEMORY DEVICE AND MANUFACTURING METHOD OF THE SAME

(71) Applicant: MACRONIX INTERNATIONAL CO., LTD., Hsinchu (TW)

(72) Inventors: Yi-Hsuan Hsiao, Hsinchu (TW); Yen-Hao Shih, New Taipei (TW); Shih-Hung Chen, Hsinchu County (TW); Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 113 days.

(21) Appl. No.: 13/965,269

(22) Filed: Aug. 13, 2013

(65) Prior Publication Data

US 2015/0048506 A1    Feb. 19, 2015

(51) Int. Cl.
  *H01L 27/06*     (2006.01)
  *H01L 27/115*    (2006.01)

(52) U.S. Cl.
  CPC ...... *H01L 27/0688* (2013.01); *H01L 27/11531* (2013.01); *H01L 27/11573* (2013.01); *H01L 27/11551* (2013.01); *H01L 27/11578* (2013.01)

(58) Field of Classification Search
  CPC .............. H01L 27/0688; H01L 27/11531; H01L 27/11551; H01L 27/11573; H01L 27/11578
  See application file for complete search history.

(56) References Cited

U.S. PATENT DOCUMENTS

| 9,082,468 | B2 | 7/2015 | Lee et al. | |
| 2009/0294833 | A1* | 12/2009 | Kim | 257/324 |
| 2011/0204309 | A1* | 8/2011 | Nitta | H01L 27/24 257/2 |
| 2014/0061750 | A1* | 3/2014 | Kwon | H01L 27/1052 257/314 |
| 2014/0146612 | A1* | 5/2014 | Helm | G11C 7/18 365/185.18 |

FOREIGN PATENT DOCUMENTS

TW    201324532 A1    6/2013

OTHER PUBLICATIONS

TW Office Action dated Jun. 25, 2015 in corresponding Taiwan application (No. 102126953).

* cited by examiner

*Primary Examiner* — Daniel Whalen
(74) *Attorney, Agent, or Firm* — McClure, Qualey & Rodack, LLP

(57) ABSTRACT

A memory device and a manufacturing method of the same are provided. The memory device includes a substrate, a 3D memory array, a periphery circuit, and a conductive connection structure. The 3D memory array and the periphery circuit are stacked on the substrate. The periphery circuit includes a patterned metal layer and a contact structure electrically connected to the patterned metal layer. The conductive connection structure is electrically connected to the patterned metal layer. The 3D memory array is electrically connected to the periphery circuit via the conductive connection structure.

18 Claims, 6 Drawing Sheets

MEMORY DEVICE AND MANUFACTURING METHOD OF THE SAME

BACKGROUND

1. Technical Field

The disclosure relates in general to a memory device and a manufacturing method thereof, and particularly to a memory device with a vertically-stacked structure and a manufacturing method thereof.

2. Description of the Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for the memory device focuses on small size and large memory capacity. For satisfying the requirement, a memory device having a high element density and a small size and the manufacturing method thereof is in need.

As such, it is desirable to develop a three-dimensional (3D) memory device with larger number of multiple stacked planes to achieve greater storage capacity, improved qualities, and yet remaining a small size.

SUMMARY

The disclosure relates in general to a memory device and a manufacturing method thereof. In the memory device, the 3D memory array and the periphery circuit are vertically stacked, such that the area occupied by elements on the surfaces of chips can be largely reduced, and the chip sizes can be effectively reduced.

According to an embodiment of the disclosure, a memory device is provided. The memory device includes a substrate, a 3D memory array, a periphery circuit, and a conductive connection structure. The 3D memory array and the periphery circuit are stacked on the substrate. The periphery circuit includes a patterned metal layer and a contact structure electrically connected to the patterned metal layer. The conductive connection structure is electrically connected to the patterned metal layer. The 3D memory array is electrically connected to the periphery circuit via the conductive connection structure.

According to another embodiment of the disclosure, a manufacturing method of a memory device is provided. The manufacturing method of the memory device includes the following steps. A substrate is provided. A 3D memory array and a periphery circuit are stacked and disposed on the substrate, wherein the periphery circuit comprises a patterned metal layer and a contact structure electrically connected to the patterned metal layer. A conductive connection structure electrically connected to the patterned metal layer is formed, wherein the 3D memory array is electrically connected to the periphery circuit via the conductive connection structure.

The above and other aspects of the disclosure will become better understood with regard to the following detailed description of the non-limiting embodiment(s). The following description is made with reference to the accompanying drawings.

DETAILED DESCRIPTION

In the embodiment of the present disclosure, a memory device and a method of manufacturing the same are provided. In the memory device, the 3D memory array and the periphery circuit are vertically stacked, such that the area occupied by elements on the surfaces of chips can be largely reduced, and the chip sizes can be effectively reduced. The following embodiments are for the purpose of elaboration only, not for limiting the scope of protection of the invention. Besides, secondary elements are omitted in the following embodiments to highlight the technical features of the invention.

Figure 1:
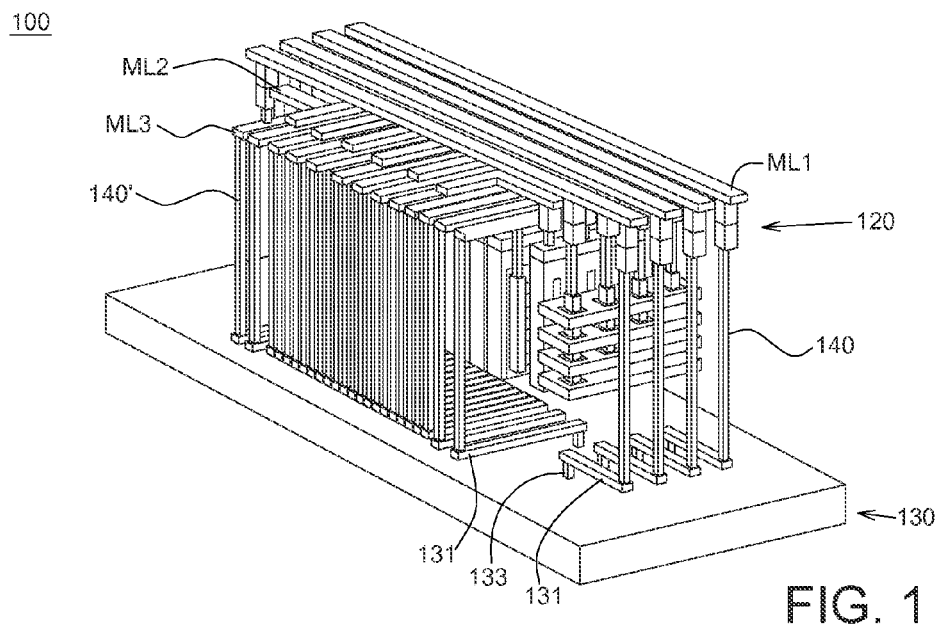
FIG. 1 shows a three-dimensional view of a memory device according to an embodiment of the present disclosure.
Figure 2:
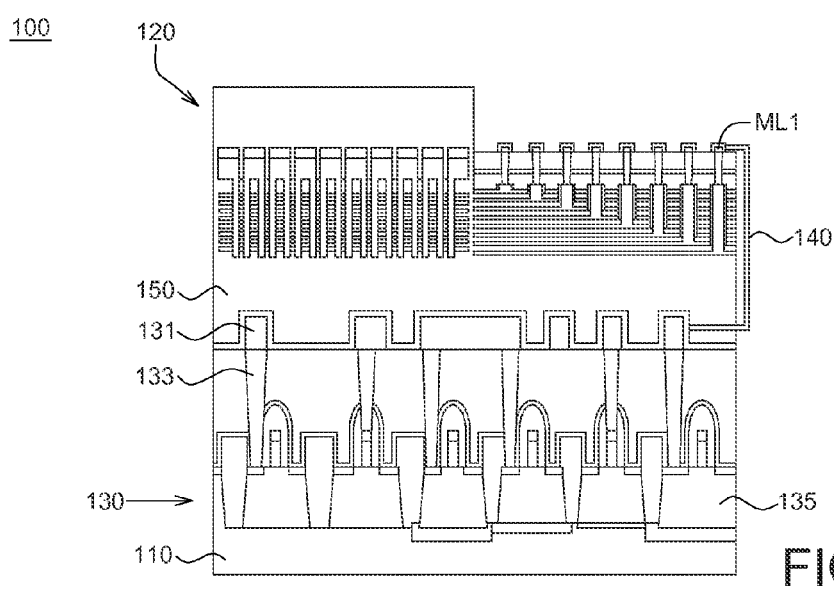
FIG. 2 shows a side view of a memory device according to an embodiment of the present disclosure.

FIG. 1 shows a three-dimensional view of a memory device 100 according to an embodiment of the present disclosure, and FIG. 2 shows a side view of a memory device 100 according to an embodiment of the present disclosure. Referring to FIGS. 1-2, the memory device 100 includes a substrate 100, a 3D memory array 120, a periphery circuit 130, and a conductive connection structure 140. The 3D memory array 120 and the periphery circuit 130 are stacked on the substrate 110. The periphery circuit 130 includes a patterned metal layer 131 and a contact structure 133 electrically connected to the patterned metal layer 131. The conductive connection structure 140 is electrically connected to the patterned metal layer 131. The 3D memory array 120 is electrically connected to the periphery circuit 130 via the conductive connection structure 140. In the present embodiment, the 3D memory array 120 is stacked on the periphery circuit 130;

accordingly, the memory device 100 has an array-on-periphery (AOP) structure.

In an embodiment, different from the contacts and metal routing(s) originally manufactured for connecting to each of the transistors 135 in the periphery circuit 130, the patterned metal layer 131 is such as an additional metal routing, and the contact structure 133 is such as an additional contact, both of which are specifically for electrically connecting the 3D memory array 120 to the periphery circuit 130.

In the memory device 100, the 3D memory array 120 is stacked on the periphery circuit 130, and the 3D memory array 120 is electrically connected to the periphery circuit 130 via the vertical conductive connection structure 140. In a conventional structure, a memory array and a periphery circuit are disposed on the same plane; in contrast, according to the embodiments of the disclosure, the 3D memory array 120 and the periphery circuit 130 are vertically stacked on a single chip, such that the area occupied by elements on the surfaces of chips can be largely reduced, and the chip sizes can be effectively reduced. For example, when the planar areas of the 3D memory array 120 and of the periphery circuit 130 are about the same, the area occupied by elements (mainly the 3D memory array 120 and the periphery circuit 130) on the surfaces of chips can be largely reduced by up to about 50% by vertically stacking the memory array 120 and the periphery circuit 130 on a single chip.

In an embodiment, as shown in FIG. 1, the conductive connection structure 140 may have a vertical cylindrical structure, and the aspect ratio of the conductive connection structure 140 is about larger than 2, preferably larger than 10.

As shown in FIG. 2, the periphery circuit 130 may further include a plurality of transistors 135, which are electrically connected to the patterned metal layer 131 via the contact structure 133. In the embodiment, the transistors 135 are such as metal oxide semiconductors (MOS).

In the embodiment, as shown in FIGS. 1-2, the periphery circuit 130 includes one patterned metal layer 131. However, the number of the patterned metal layer 131 may increase depending on the conditions applied, since the patterned metal layer 131 is for electrically connecting the contact structure 133 and the conductive connection structure 140, and the number of the contact structure 133 may increase as well depending on the conditions applied; for that reason, the numbers of the patterned metal layer 131 and the contact structure 133 are limited to the numbers aforementioned.

In the embodiment, the materials of the patterned metal layer 131 and the contact structure 133 have low sheet resistance and high temperature stability. For example, the materials of the patterned metal layer 131 and the contact structure 133 may independently be at least one of aluminum, copper, tungsten, or metal silicide. The materials of the patterned metal layer 131 and the contact structure 133 may influence the operating temperature of the subsequent manufacturing processes. For example, when tungsten is used as the materials of the patterned metal layer 131 and the contact structure 133, the temperature of back end of line (BEOL) process may be held at up to about 800° C. On the other hand, while aluminum or copper is used as the materials of the patterned metal layer 131 and the contact structure 133, although the temperature of BEOL may need to be held at lower than about 400° C., aluminum or copper is provided with high conductivity, As shown in FIGS. 1-2, the 3D memory array 120 includes at least a metal layer ML1 electrically connected to the conductive connection structure 140. In the embodiment, as shown in FIG. 1, the 3D memory array 120 includes, for example, metal layers ML1, ML2, and ML3. The conductive connection structure 140 is electrically connected to the metal layer ML1, the conductive connection structure 140' is electrically connected to the metal layer ML3, and the 3D memory array 120 may also be electrically connected to the patterned metal layer 131, the contact structure 133, and the periphery circuit 130 sequentially via the conductive connection structure 140'.

In an embodiment, the 3D memory array 120 may be a 3D vertical gate NAND flash memory, the metal layer ML1 may be word lines, the metal layer ML2 may be string select lines, and the metal layer ML3 may be bit lines. However, the types and numbers of the metal layers may vary depending on the conditions applied and are not limited to the types and numbers aforementioned.

As shown in FIGS. 1-2, in the present embodiment, the 3D memory array 120 is stacked on the periphery circuit 130, and the patterned metal layer 131 is disposed between the 3D memory array 120 and the periphery circuit 130. In the embodiment, the memory device 100 may further include an insulating layer 150, which is disposed between the 3D memory array 120 and the periphery circuit 130 and covering the patterned metal layer 131. The surface of the insulating layer 150 adjacent to the 3D memory array 120 is a flat surface. In the embodiment, the insulating layer 150 is such as an interlayer dielectric.

Figure 3:
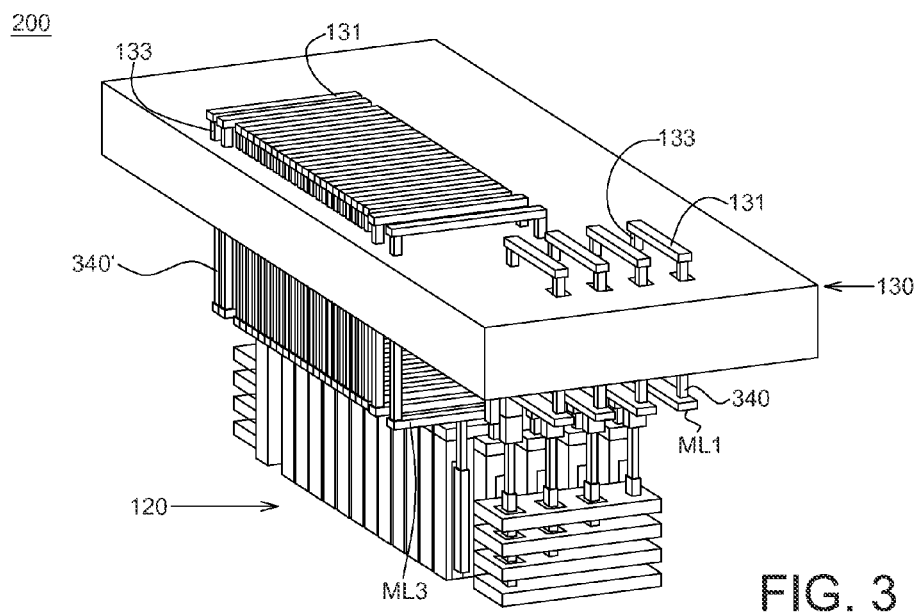
FIG. 3 shows a three-dimensional view of a memory device according to another embodiment of the present disclosure.
Figure 4:
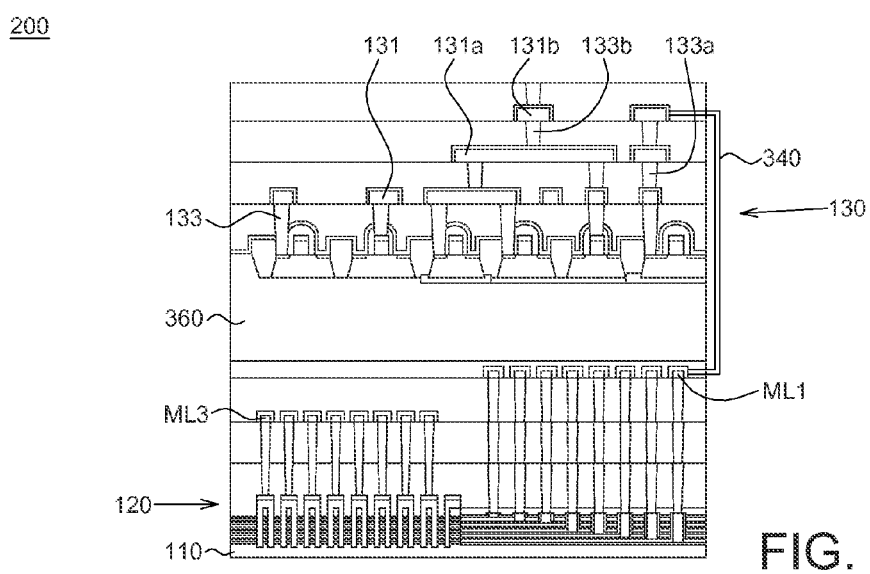
FIG. 4 shows a side view of a memory device according to another embodiment of the present disclosure.

FIG. 3 shows a three-dimensional view of a memory device 200 according to another embodiment of the present disclosure, and FIG. 4 shows a side view of a memory device 200 according to another embodiment of the present disclosure. Referring to FIGS. 3-4, the memory device 200 of the present embodiment is different from the memory device 100 of the previous embodiment in that the 3D memory array and the periphery circuit are stacked in a different fashion. In the present embodiment, the periphery circuit 130 is stacked on the 3D memory array 120; accordingly, the memory device 200 has a periphery-on-array (POA) structure.

Likewise, in the memory device 200, the periphery circuit 130 is stacked on the 3D memory array 120. According to the embodiments of the disclosure, the 3D memory array 120 and the periphery circuit 130 are vertically stacked on a single chip, such that the area occupied by elements on the surfaces of chips can be largely reduced by about 50%, and the chip sizes can be effectively reduced.

In the embodiment, as shown in FIG. 4, the periphery circuit 130 includes, for example, a plurality of patterned metal layers 131, 131*a*, 131*b* and a plurality of contact structures 133, 133*a*, 133*b*. The transistors 135 of the periphery circuit 130 are electrically connected to the conductive connection structure 340 via the patterned metal layers 131, 131*a*, 131*b* and the contact structures 133, 133*a*, 133*b*, and are further electrically connected to the 3D memory array 120.

As shown in FIGS. 3-4, in the present embodiment, the periphery circuit 130 is stacked on the 3D memory array 120. In an embodiment, as shown in FIG. 4, the memory device 200 may further include an epi-Si layer 360, which is disposed between the 3D memory array 120 and the periphery circuit 130. The surface of the epi-Si layer 360 adjacent to the periphery circuit 130 is a flat surface. In an alternative embodiment, the memory device 200 may further include a silicon-on-insulator (SOI) layer (not shown) as well, which is disposed between the 3D memory array 120 and the periphery circuit 130. The surface of the SOI layer adjacent to the periphery circuit 130 is a flat surface.

Figure 5:
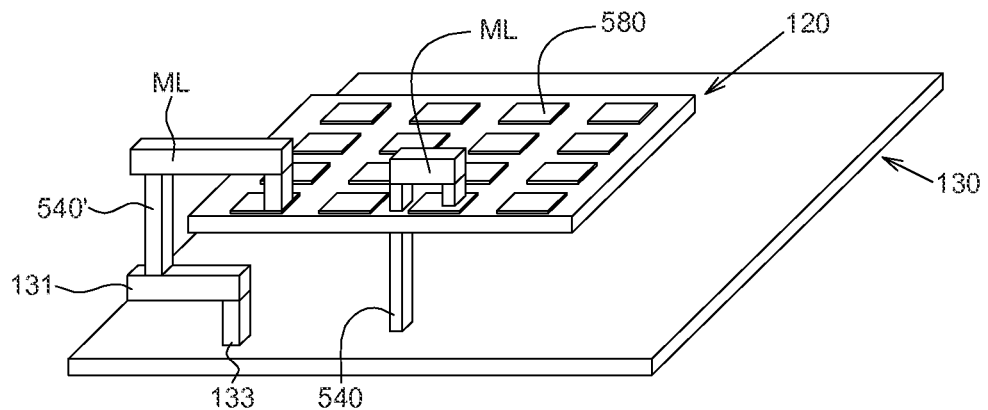
FIG. 5 shows a simplified three-dimensional view of conductive connection structures according to embodiments of the present disclosure.

FIG. 5 shows a simplified three-dimensional view of conductive connection structures according to embodiments of the present disclosure. The conductive connection structure may electrically connect the 3D memory array 120 to the periphery circuit 130 through the interior of the 3D memory array 120 or outside of the 3D memory array 120.

In an embodiment, as shown in FIG. 5, an opening formation process may be performed to the 3D memory array 120 and between the chips 580 for manufacturing the conductive connection structure 540. While the process of manufacturing the conductive connection structure 540 within the interior of the 3D memory array 120 may be complex, due to the fact that the design of the locations and formation of the openings (conductive connection structure 540) have to adapt to the existed structure design of the array; nevertheless, the trace length is relatively short, resulting in a shorter RC delay. As shown in FIG. 5, an end of the conductive connection structure 540 may be directly connected to the existing metal routing, which is different from any patterned metal layer 131 aforementioned, of the transistors 135 of the periphery circuit 130, and the other end of the conductive connection structure 540 is connected to the metal layer ML of the 3D memory array 120.

In another embodiment, as shown in FIG. 5, the conductive connection structure 540' may be formed outside the 3D memory array 120.

Despite the longer trace length and the resulting longer RC delay, the manufacturing process of the conductive connection structure 540' outside the 3D memory array 120 is a lot simpler, resulting in an improved manufacturing yield. As shown in FIG. 5, an end of the conductive connection structure 540' is connected to the patterned metal layer 131 and the contact structure 133, and the other end of the conductive connection structure 540' is connected to the metal layer ML of the 3D memory array 120. For example, as shown in FIG. 1, in the memory device 100, the conductive connection structures 140, 140' are formed outside the 3D memory array 120.

The embodiments disclosed below are for elaborating a manufacturing method of the memory device of the disclosure. However, the descriptions disclosed in the embodiments of the disclosure such as detailed manufacturing procedures are for illustration only, not for limiting the scope of protection of the disclosure. It is noted that some of the components are drawn in a perspective fashion and secondary elements are omitted for further elaborating the present disclosure.

Figure 6A:
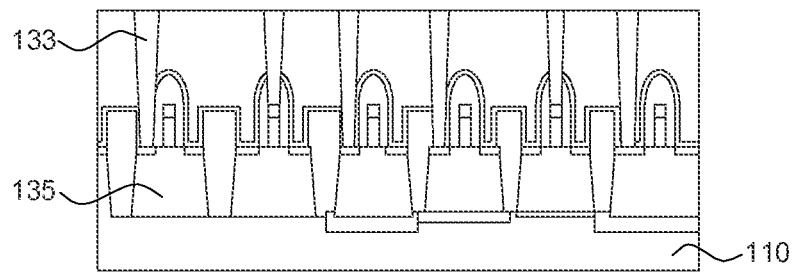
FIGS. 6A-6C illustrate a process for manufacturing a memory device according to an embodiment of the present disclosure.
Figure 6B:
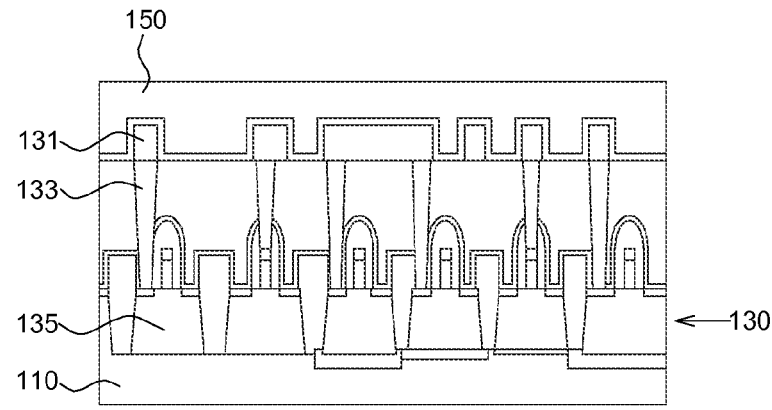
Figure 6C:
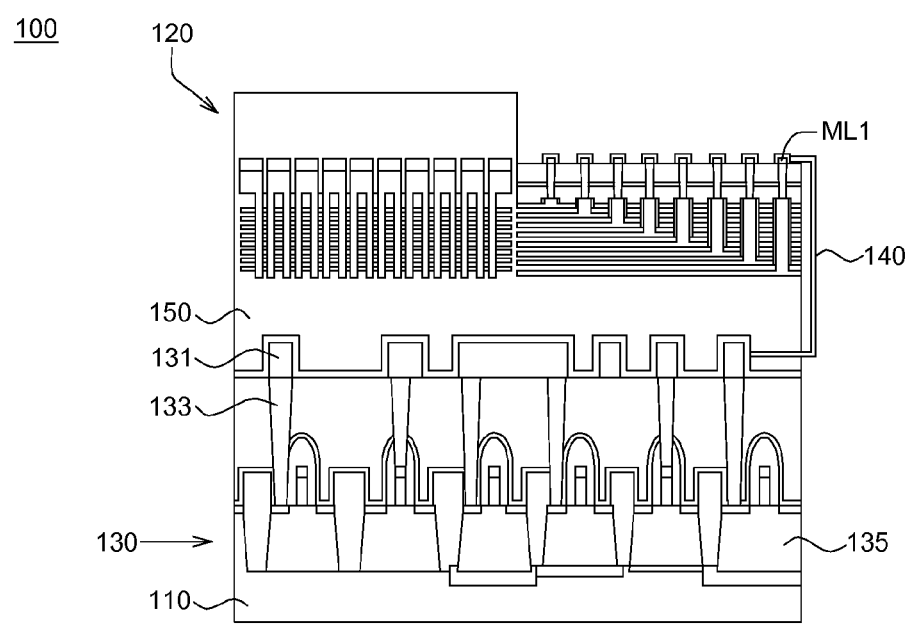

FIGS. 6A-6C illustrate a process for manufacturing a memory device 100 according to an embodiment of the present disclosure. Please refer to FIGS. 6A-6C.

As shown in FIGS. 6A-6B, a substrate 110 is provided, and the periphery circuit 130 is formed on the substrate 110. In the embodiment, the step of forming the periphery circuit 130 includes, such as, forming the patterned metal layer 131, the contact structure 133, and the transistors 135.

The contact structure 133 is electrically connected to the patterned metal layer 131, and the transistors 135 are electrically connected to the patterned metal layer 131 via the contact structure 133.

Next, as shown in FIG. 6B, the insulating layer 150 is disposed on the periphery circuit 130 and covering the patterned metal layer 131. In the embodiment, for example, the insulating layer 150 is formed on the patterned metal layer 131 followed by the planarization of the surface of the insulating layer 150. The planarization process of the surface of the insulating layer 150 is crucial; the flat surface is advantageous to performing the following stacking process.

Next, as shown in FIG. 6C, the 3D memory array 120 is stacked on the periphery circuit 130, the conductive connection structure 140 is formed, and the BEOL (not shown) is manufactured. In the embodiment, the 3D memory array 120 is formed on the flat surface of the insulating layer 150. In other words, the patterned metal layer 131 and the insulating layer 150 are both disposed between the 3D memory array 120 and the periphery circuit 130. As such, the memory device 100 as shown in FIG. 6C (FIG. 2) is formed.

In the embodiment, the conductive connection structure 140 may be formed by forming a plurality of trenches or a patterned metal connection layer (not shown) in an oxide layer (e.g. the insulating layer 150), the trenches or the patterned metal connection layer connecting to the patterned metal layer 131 of the periphery circuit 130, and filling up a conductive material into the trenches. The above manufacturing steps can be performed, for example, when BEOL is manufactured, that is, after the surface of the insulating layer 150 is planarized. The 3D memory array 120 includes at least one metal layer ML1. The conductive connection structure 140 is electrically connected to the patterned metal layer 131 and the metal layer ML1. The 3D memory array 120 is electrically connected to the periphery circuit 130 via the vertical conductive connection structure 140.

Figure 7A:
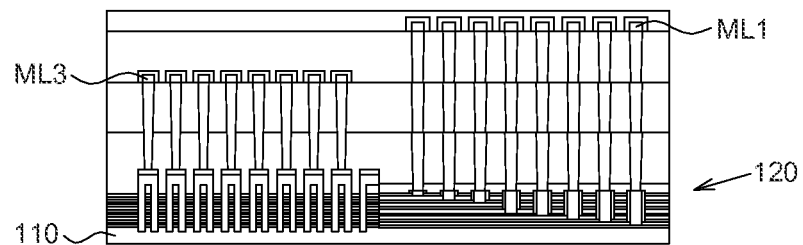
FIGS. 7A-7C illustrate a process for manufacturing a memory device according to another embodiment of the present disclosure.
Figure 7B:
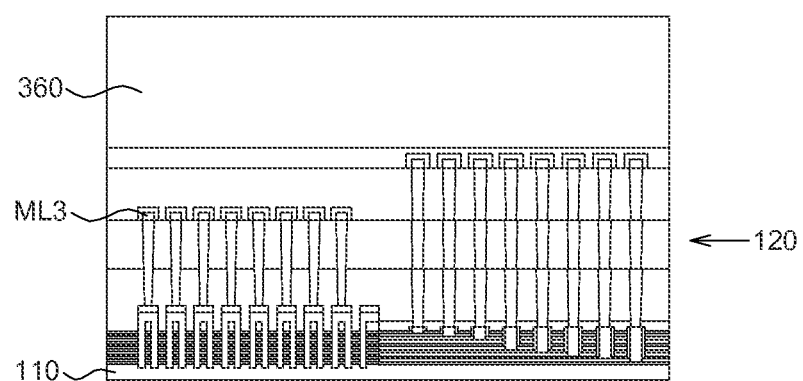
Figure 7C:
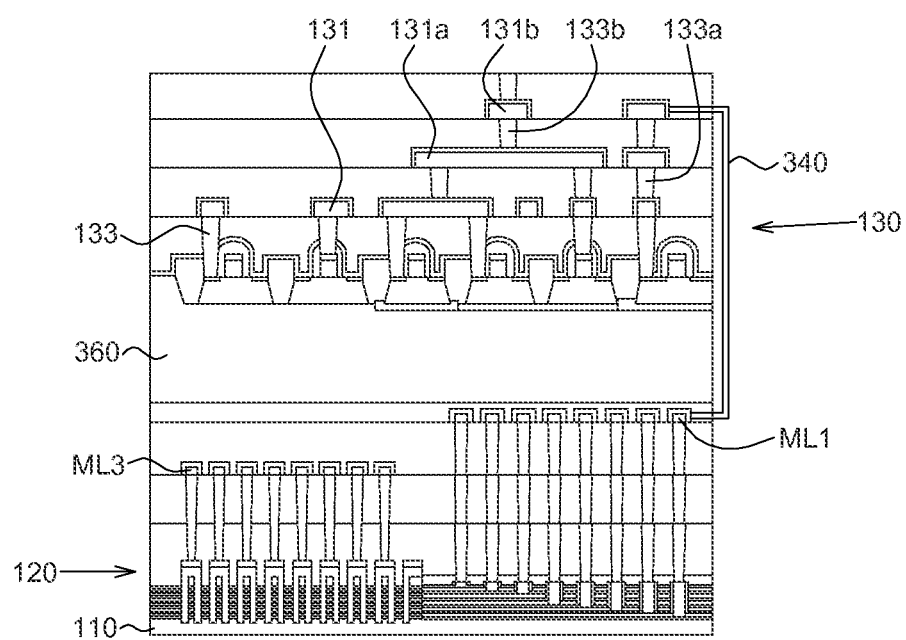

FIGS. 7A-7C illustrate a process for manufacturing a memory device according to another embodiment of the present disclosure. Please refer to FIGS. 7A-7C.

As shown in FIG. 7A, the substrate 110 is provided, and the 3D memory array 120 is formed on the substrate 110. The 3D memory array 120 includes at least one metal layer ML1 for electrically connecting to the conductive connection structure, which will be manufactured in the subsequent processes.

Next, as shown in FIG. 7B, the epi-Si layer 360 is formed on the 3D memory array 120. In an alternative embodiment, a SOI layer (not shown) may be formed on the 3D memory array 120. The formation of the epi-Si layer 360 or the SOI layer is crucial. As such, the periphery circuit 130 can be formed directly on the epi-Si layer 360 or the SOI layer, such that currently available manufacturing process can be applied for stacking the periphery circuit 130, which process can be compatible with the current manufacturing process of the 3D memory array 120 as well, and the feasibility of the manufacturing process of the memory device 200 is thus greatly enhanced.

Next, as shown in FIG. 7C, the periphery circuit 130 is stacked on the 3D memory array 120, the conductive connection structure 140 is formed, and the BEOL (not shown) is manufactured. In the embodiment, the conductive connection structure 140 may be formed by forming a plurality of trenches or a patterned metal connection layer (not shown) in an oxide layer, the trenches or the patterned metal connection layer connecting to the metal layer (e.g. metal layer ML1) of the 3D memory array 120, and filling up a conductive material into the trenches. The above manufacturing steps can be performed, for example, when BEOL is manufactured. In the embodiment, the step of stacking the periphery circuit 130 includes, such as, forming the patterned metal layer 131, the contact structure 133, and the transistors 135. The contact structure 133 is electrically connected to the patterned metal layer 131, and the transistors 135 are electrically connected to the patterned metal layer 131 via the contact structure 133. The conductive connection structure 140 is electrically connected to the patterned metal layer 131 and the metal layer ML1. The 3D memory array 120 is electrically connected to the periphery circuit 130 via the vertical conductive connection structure 140. In the embodiment, the periphery circuit 130 is formed on the epi-Si layer 360 or the SOI layer. In other words, the epi-Si layer 360 or the 501 layer is disposed between the 3D memory array 120 and the periphery circuit 130. As such, the memory device 200 as shown in FIG. 7C (FIG. 4) is formed.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a substrate;
   a 3D memory array comprising a first metal layer and a second metal layer disposed beneath the first metal layer, wherein a longitudinal direction of the first metal layer is perpendicular to a longitudinal direction of the second metal layer;
   a periphery circuit stacked on the substrate, the periphery circuit comprising:
      a patterned metal layer comprising a first portion and a second portion; and a contact structure electrically connected to the patterned metal layer; and a first conductive connection structure and a second conductive connection structure, each of the first conductive connection structure and the second conductive connection structure being respectively electrically connected to a corresponding one of the two portions of the patterned metal layer, wherein the 3D memory array is electrically connected to the periphery circuit via the first conductive connection structure and the second conductive connection structure, and the first metal layer is electrically connected to the periphery circuit via the first conductive connection structure, and the second metal layer is electrically connected to the periphery circuit via the second conductive connection structure.

2. The memory device according to claim 1, wherein the periphery circuit further comprises a plurality of transistors electrically connected to the patterned metal layer via the contact structure.

3. The memory device according to claim 1, wherein the 3D memory array is stacked on the periphery circuit.

4. The memory device according to claim 3, further comprising:
   an insulating layer disposed between the 3D memory array and the periphery circuit and covering the patterned metal layer.

5. The memory device according to claim 3, wherein the patterned metal layer is disposed between the 3D memory array and the periphery circuit.

6. The memory device according to claim 1, wherein the periphery circuit is stacked on the 3D memory array.

7. The memory device according to claim 6, further comprising:
   an epi-Si layer or a silicon-on-insulator (SOI) layer disposed between the 3D memory layer and the periphery circuit.

8. The memory device according to claim 1, wherein the materials of the patterned metal layer and the contact structure independently comprise at least one of aluminum, copper, tungsten, or metal silicide, respectively.

9. The memory device according to claim 1, wherein each of the first conductive connection structure and the second conductive connection structure has an aspect ratio of larger than 2.

10. A manufacturing method of a memory device, comprising:
    providing a substrate;
    disposing a 3D memory array and a periphery circuit stacked on the substrate, wherein the 3D memory array comprises a first metal layer and a second metal layer disposed beneath the first metal layer, a longitudinal direction of the first metal layer is perpendicular to a longitudinal direction of the second metal layer, and the periphery circuit comprises: a patterned metal layer comprising a first portion and a second portion; and a contact structure electrically connected to the patterned metal layer; and forming a first conductive connection structure and a second conductive connection structure, each of the first conductive connection structure and the second conductive connection structure being respectively electrically connected to a corresponding one of the two portions of the patterned metal layer, wherein the 3D memory array is electrically connected to the periphery circuit via the first conductive connection structure and the second conductive connection structure, and the first metal layer is electrically connected to the periphery circuit via the first conductive connection structure, and the second metal layer is electrically connected to the periphery circuit via the second conductive connection structure.

11. The manufacturing method of the memory device according to claim 10, wherein the periphery circuit further comprises a plurality of transistors electrically connected to the patterned metal layer via the contact structure.

12. The manufacturing method of the memory device according to claim 10, wherein the step of disposing the 3D memory array and the periphery circuit stacked on the substrate comprises:
    forming the periphery circuit on the substrate; and
    stacking the 3D memory array on the periphery circuit.

13. The manufacturing method of the memory device according to claim 12, further comprising:
    disposing an insulating layer between the 3D memory array and the periphery circuit and covering the patterned metal layer.

14. The manufacturing method of the memory device according to claim 12, wherein the patterned metal layer is disposed between the 3D memory array and the periphery circuit.

15. The manufacturing method of the memory device according to claim 10, wherein the step of disposing the 3D memory array and the periphery circuit stacked on the substrate comprises:
    forming the 3D memory array on the substrate; and
    stacking the periphery circuit on the 3D memory array.

16. The manufacturing method of the memory device according to claim 15, further comprising:
    disposing an epi-Si layer or a SOI layer between the 3D memory array and the periphery circuit.

17. The manufacturing method of the memory device according to claim 10, wherein the materials of the patterned metal layer and the contact structure independently comprise at least one of aluminum, copper, tungsten, or metal silicide, respectively.

18. The manufacturing method of the memory device according to claim 10, wherein each of the conductive connection structure and the second conductive connection structure has an aspect ratio of larger than 2.

* * * * *